(12) United States Patent
Suzuki

(10) Patent No.: US 6,466,027 B1
(45) Date of Patent: Oct. 15, 2002

(54) APPARATUS FOR MEASURING ELECTRIC CHARGE

(75) Inventor: Kouichi Suzuki, Tokyo (JP)

(73) Assignee: NEC Corporation (JP)

( * ) Notice: Subject to any disclaimer, the term of this patent is extended or adjusted under 35 U.S.C. 154(b) by 20 days.

(21) Appl. No.: 09/691,588

(22) Filed: Oct. 18, 2000

(30) Foreign Application Priority Data

Oct. 20, 1999 (JP) ............................................ 11-298798

(51) Int. Cl.[7] ...................... G01R 29/12; G01R 31/302; G01R 31/26
(52) U.S. Cl. ...................... 324/458; 324/750; 324/765
(58) Field of Search ................................. 324/458, 765, 324/456, 457, 452, 750

(56) References Cited

U.S. PATENT DOCUMENTS 5,703,487 A * 12/1997 Mishra ........................ 324/456

FOREIGN PATENT DOCUMENTS

JP             2908240       4/1999    ........... G01R/29/24

* cited by examiner

*Primary Examiner*—N. Le
*Assistant Examiner*—James Kerveros
(74) *Attorney, Agent, or Firm*—Hayes Soloway P.C.

(57) ABSTRACT

An apparatus for measuring an electrostatic charge includes a conductive plate a voltage source a first switch for connecting the conductive plate to the voltage source or to the ground potential and an insulator membrane arranged on the conductive plate upon a sample element is to be placed. A conductive grounded plate is arranged parallel to the conductive plate, and a conductive probe is secured to the grounded plate through an insulator material for picking up the electrostatic charge induced in the sample element from the surface of the sample element. A coulomb meter with a first electrode is connected to the grounded plate for indicating the quantity of the electrostatic charge. Completing the apparatus is a second switch for connecting the probe to the second electrode of the coulomb meter or the grounded plate.

4 Claims, 3 Drawing Sheets

APPARATUS FOR MEASURING ELECTRIC CHARGE

BACKGROUND OF THE INVENTION

1. Field of the Invention

The present invention relates to an apparatus for measuring an electrostatic charge and particularly to an apparatus for measuring an electrostatic charge born on a semiconductor device.

2. Description of the Related Art

A semiconductor device is commonly produced by: forming a plurality of semiconductor devices on a substrate of Si (silicon) or GaAs (gallium arsenide); sawing or machining the substrate into individual semiconductor devices (each referred to as a die) by the dicing process; mounting the die in a package and connecting electrodes formed on the die to external leads using gold wires; and finally completing the manufacturing procedure by sealing the package in, for example, resin.

Quality deficiencies in semiconductor devices have been caused by failures in the processes of forming semiconductor devices on a substrate: for example, failure in the photolithography to form a pattern of a designed size; and penetration fault of a contact hole to be penetrated through an insulator layer to connect upper and lower wiring layers.

Recently, the tendency of decreasing a size of a semiconductor device has carried about a deteriorated immunity from static electricity of a semiconductor device. As a result, quality deficiencies caused by static electricity have increased in addition to those caused by faulty processes as described above.

The present inventor et al. have disclosed an apparatus for measuring an electrostatic charge to track the sources of the deficiencies in Japanese Patent Publication No. 2908240.

The measuring apparatus will be set forth with reference to the drawings below.

FIG. 1 is a schematic diagram of the apparatus described in the quoted literature. A dielectric substance 4 of a known dielectric constant surrounds a metal rod 14. Grounded metal plate 15 covers dielectric substance 4.

The wiring arranged between an object to be measured and dielectric substance 4 is positionally fixed with respect to dielectric substance 4 to keep the relative position unchanged, thereby preventing measured values from being varied by a deformation of the wiring. Since metal plate 15 shields metal rod 14 from an external electromagnetic wave, the measurement of the electrostatic charge is screened from an electromagnetic induction. Furthermore, dielectric substance 4 is configured so as to set up a distributed capacity along the path through which the charge to measured conducts. This configuration of dielectric substance 4 allows the distributed capacitor to be charged delaying successively from the proximity of the object to be measured, thereby preventing voltmeter 5 from being instantaneously applied with a high electric tension of the object. In this way, the electrostatic charge to be measured is prevented from leaking through voltmeter 5 to the ground.

FIGS. 2(a) and 2(b) represent an example in which the above-described measuring apparatus is applied to the manufacturing process of an LSI.

In this example, an electric charge was measured that was created at a lead terminal caused by dynamic friction when LSI 16 was slid on a sloped metal rail 17 and carried from the top to the bottom, as is shown in FIG. 2(a).

Such a carrying system has been often employed in a process step of manufacturing an LSI. The measurement is carried out by two procedures: the preliminary procedure and the measurement procedure. The preliminary procedure is performed, as is shown in FIG. 1, by connecting metal plate 15 arranged outermost of the measuring apparatus to the ground potential; connecting voltmeter 5 between the top end of inner metal rod 14 and the ground potential; and sufficiently discharging the capacitor made up of metal rod 14, metal plate 15 and dielectric substance 4 by shortcircuiting metal rod 14 and metal plate 15.

Next, the measurement procedure is carried out, as is shown in enlarged exploded FIG. 2(b), by bringing the pointed bottom tip of metal rod 14 into contact with lead terminal 18 of LSI 16 that has slid down on metal rail 17; and observing the value indicated in voltmeter 5 and calculating electric charge caused by the dynamic friction Q from the equation $Q=CV$.

Lately, the tendency toward miniaturizing a semiconductor device such as an MR head (magneto-resistive head) for reading magnetic data in semiconductor ICs (a DRAM, a processor and a CCD) and a hard-disk has been rapidly advanced.

Miniaturizing of semiconductor devices entails high susceptibility to an electrostatic charge created on a semiconductor device while it is manufactured, assembled and practically used. For this reason, there is an urgent need to improve a technique for measuring an electrostatic charge born on a semiconductor device to protect the device from problems caused by the electric charge.

The traditional measuring apparatus employing a coulomb meter has been difficult to measure an electrostatic charge induced within the semiconductor device, while it has been useful for the measurement of an electrostatic charge externally charged on the sample to be subjected to the measurement.

However, there are many process steps in a manufacturing line in which an electric charge is induced in a product, for example, the step of adsorption by a nozzle and the step of mounting a semiconductor device to a substrate. Since the traditional measuring apparatus is unable to measure an electric charge charged on a product from an external source, for example, from a charged human body, a problem encountered has been that it is impossible to track the source of a defect of a product presumably caused by a charge induced within the product. As a result, it has been impossible to eliminate deficiencies arising from electrostatic charge charged in a manufacturing line.

The background of the above-described problem is that in the front-end techniques since 1997, the products such as a hard disk of a high storing density, a liquid crystal display for displaying a picture of a high definition and a plasma display as well as an electronic device have suffered from troubles due to an electrostatic charge and such troubles take place very frequently not only in a manufacture line but also in an assembly line.

For example, the wiring rule of a large-scale integrated circuit is now going down to less than 0.25 $\mu$m and will presumably reach 0.18 $\mu$m in 2000. Furthermore, the area of each pixel in a picture CCD has been miniaturized in order to improve fineness of a picture.

A storing density of a hard disk, on the other hand, has been increased to as high as 5–15 GBit/inch$^2$, which has enabled the realization of a miniaturized head for read and/or write.

In the field of the liquid crystal display (LCD) as well, improvement of the resolution has been advanced through miniaturization of a display pixel. As the digital broadcast becomes full-fledged and the high-vision TV becomes widespread in the near future, the pixels in the picture display such as a plasma display will be miniaturized entailing susceptibleness to an electrostatic charge.

The minimum quantity of the static electricity that affects a miniaturized semiconductor device is not included in the range of the precision of the above-described traditional apparatus. Thus, an improvement of the apparatus is required.

In Southeast Asia where manufacture sites have shifted to as well as in Japan, U.S.A. and Europe, problems caused by static electricity in manufacture lines and markets have been occurring in rapid succession. Thus, there is an urgent need to eliminate such problems. For this reason, it is necessary to provide for measurement of an electrostatic charge with improved precision and simplicity.

It is an object of the present invention to provide an apparatus capable of measuring an electrostatic charge induced within a test sample while the conventional method has been capable of measuring only an externally charged electrostatic charge. The present invention is specifically directed to eliminating problems due to an induced electrostatic charge in:a manufacture line by tracking the sources that induce the electrostatic charge. Specifically, the present invention concerns the process step such as adsorption by a nozzle in which the induction of an electrostatic charge is liable to take place.

SUMMARY OF THE INVENTION

In order to achieve the above-described object of the present invention, the apparatus for measuring an electrostatic charge according to the present invention comprises: a conductive plate; a voltage source; a first switch for connecting the conductive plate to the voltage source or to the ground potential; an insulator membrane arranged on the conductive plate for putting a sample element thereon; a conductive grounded plate arranged parallel to the conductive plate; a conductive probe secured to the grounded plate through insulator material for picking up an electrostatic charge induced in the sample element from the surface of the sample element; a coulomb meter with a first electrode connected to the grounded plate for indicating the quantity of the electrostatic charge; and a second switch for connecting the probe to a second electrode of the coulomb meter or the grounded plate.

In this way, the apparatus of the present invention is capable of measuring an electrostatic charge induced within a test sample while the conventional apparatus has been capable of measuring only an externally charged electrostatic charge.

Thus, the present invention enables to measure all factors that concern deficiencies originating in the electrostatic charging in a manufacture line, allowing to grasp the deficiencies to eliminate them.

The above and other objects, features and advantages of the present invention will become apparent from the following description referring to the accompanying drawings which illustrate an example of a preferred embodiment of the present invention.

DETAILED EXPLANATION OF THE PREFERRED EMBODIMENT

Figure 1:
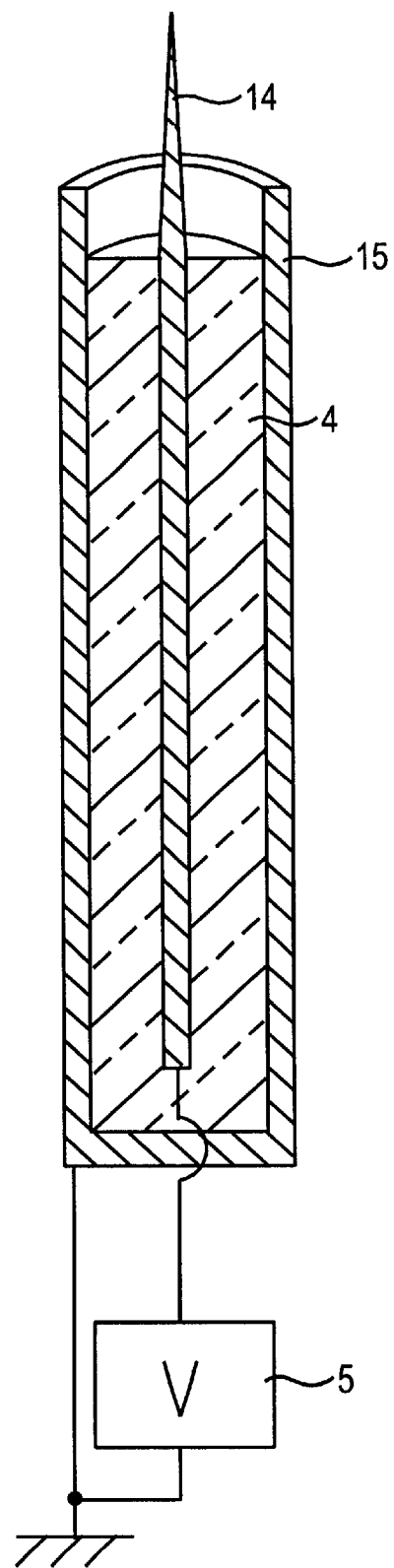
FIG. 1 is a schematic diagram of a traditional apparatus for measuring an electrostatic charge.
Figure 2A:
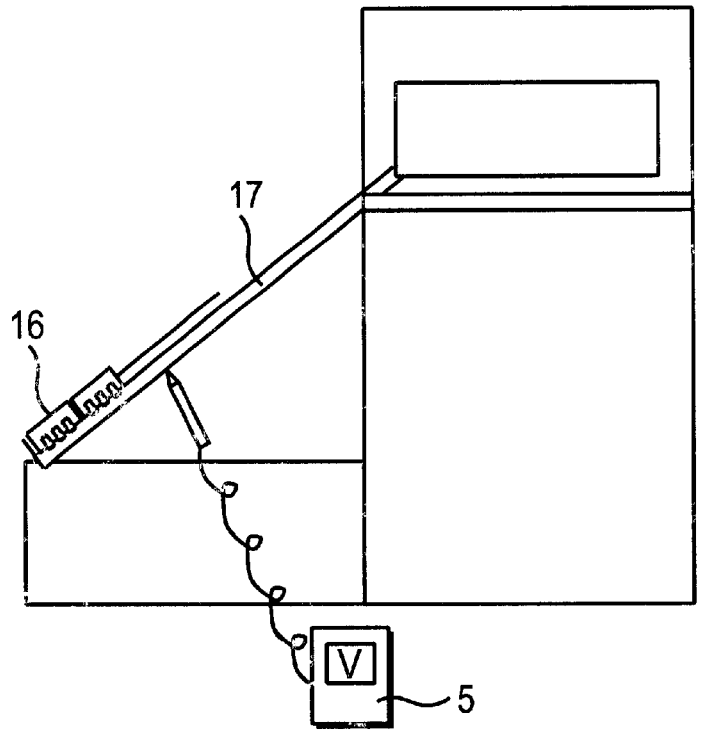
FIGS. 2(a) and 2(b) represent an example in which the traditional measuring apparatus is applied to the manufacturing process of an LSI.
Figure 2B:
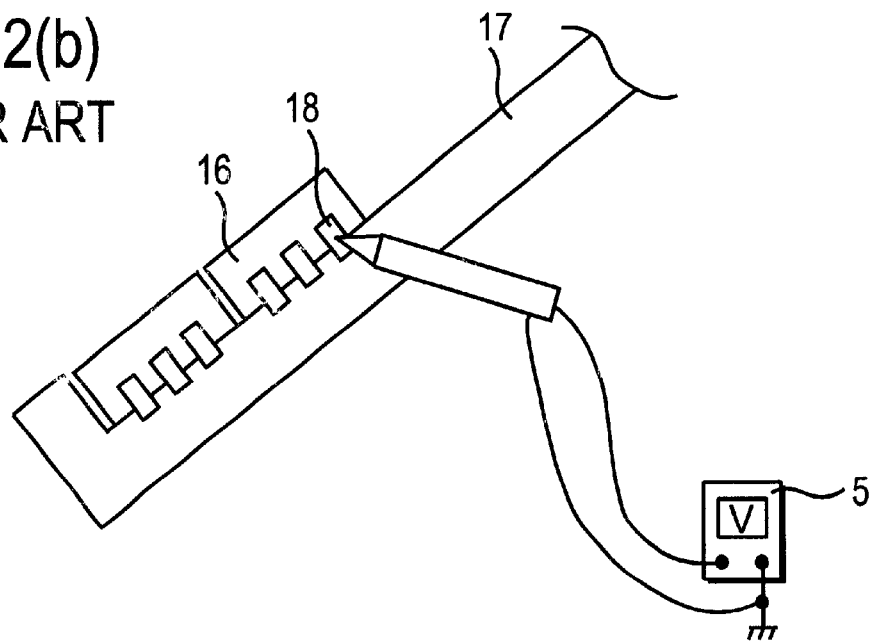
Figure 3:
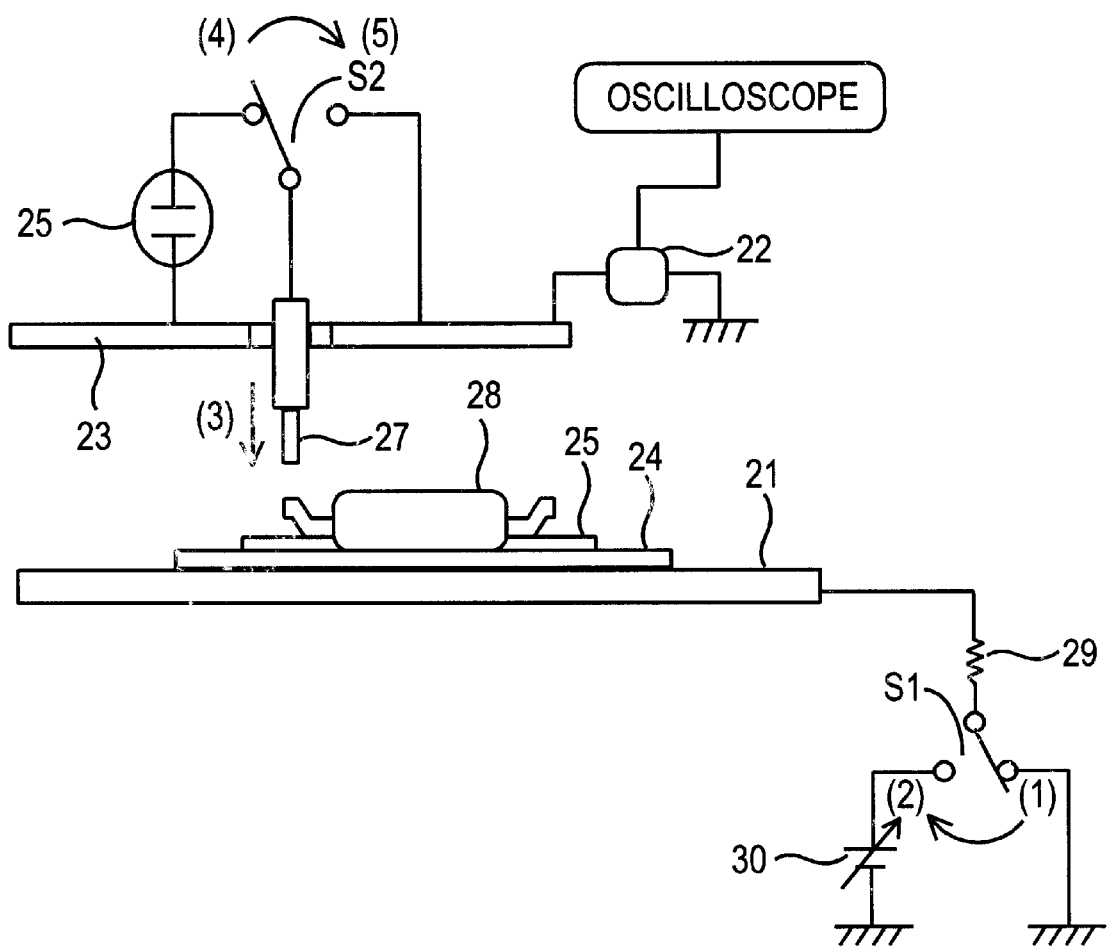
FIG. 3 is a schematic diagram of the field-induced electric charge meter according to the present invention.

Now we will explain an embodiment of the field-induced electric charge meter with reference to FIG. 3.

FIG. 3 is a schematic diagram of the field-induced electric charge meter according to the present invention.

The electric charge meter is provided with conductive plate 21 of conductive material such as metal; insulating film 24 mounted on conductive plate 21; a platform made of insulating membrane 25 for securing a sample, surface grounded plate 23 of conductive material such as metal arranged substantially parallel to conductive plate 21; probe 27 secured to surface grounded plate 23 interposed with insulator; coulomb meter 26 one electrode of which is connected to surface grounded plate 23; switch S2 with a first contact connected to another electrode of coulomb meter 26, a second contact connected to surface grounded plate 23 and common terminal connected to probe 27; galvanometer 22 connected between surface grounded plate 23 and the ground potential; switch S1 with common terminal connected to conductive plate 21 through resistor 29 (300 Mv) and a first contact connected to the ground potential; and voltage source 30 connected between a second contact of switch S1 and the ground potential. In addition, an oscilloscope is connected to galvanometer 22.

In operation, sample element 28 is mounted on the platform. When the sample element is a semiconductor device, the measurement is performed by arranging probe 27 directly on the sample element.

An electric charge can be induced in sample element 28 arranged between surface grounded plate 23 and conductive plate 21 by placing sample element 28 on conductive plate 21, grounding the surface grounded plate 23 and connecting conductive plate 21 to voltage source 30.

It is to be noted that, should surface grounded plate 23 not be provided, it is impossible to measure a charge induced in the sample element by friction or the like, while a charge externally charged on the sample element can be measured.

It is to be understood, however, that although the characteristics and advantages of the present invention have been set forth in the foregoing description, the disclosure is illustrative only, and changes may be made in the shape, size, and arrangement of the parts within the scope of the appended claims.

What is claimed is:

1. An apparatus for measuring an electrostatic charge on a sample semiconductor device comprising: a conductive plate; a voltage source; a first switch for connecting said conductive plate to said voltage source or to a ground potential; an insulator membrane arranged on said conductive plate for placement of said sample semiconductive device thereon; a conductive grounded plate arranged parallel to and spaced from said conductive plate and said insulator membrane; a conductive probe secured to said grounded plate through an insulator material for picking up an electrostatic charge induced in said sample element from a surface of said sample semiconductor device; a coulomb meter with a first electrode connected to said grounded plate for indicating a quantity of said electrostatic charge; and a second switch for connecting said probe to a second electrode of said coulomb meter or said grounded plate.

2. An apparatus according to claim 1, wherein said first switch is connected to said conductive plate through a resistor.

3. An apparatus according to claim 2, and further comprising a galvanometer connected between said conductive grounded plate and ground.

4. An apparatus according to claim 3, and further comprising an oscilloscope connected to said galvanometer.

* * * * *